(12) United States Patent
Lee et al.

(10) Patent No.: US 7,259,592 B2
(45) Date of Patent: Aug. 21, 2007

(54) OUTPUT DRIVERS HAVING ADJUSTABLE SWING WIDTHS DURING TEST MODE OPERATION

(75) Inventors: Seung-hoon Lee, Gyeonggi-do (KR);
Kee-won Kwon, Gyeonggi-do (KR);
Jung-hwan Choi, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 233 days.

(21) Appl. No.: 11/098,818

(22) Filed: Apr. 5, 2005

(65) Prior Publication Data

US 2005/0218934 A1  Oct. 6, 2005

(30) Foreign Application Priority Data

Apr. 6, 2004  (KR) .................. 10-2004-0023339
May 14, 2004  (KR) .................. 10-2004-0034287

(51) Int. Cl.
*H03K 19/094* (2006.01)
*H03K 5/22* (2006.01)

(52) U.S. Cl. .................. 326/83; 326/68; 326/86; 327/65; 327/112

(58) Field of Classification Search .......... 326/17, 326/57, 58, 63, 68, 83, 86, 112, 119; 327/65, 327/112
See application file for complete search history.

(56) References Cited

U.S. PATENT DOCUMENTS 4,408,135 A    10/1983  Yuyama et al.
5,197,033 A    3/1993  Watanabe et al.
5,583,457 A    12/1996  Horiguchi et al.
5,831,467 A    11/1998  Leung et al.
6,084,434 A    7/2000  Keeth
6,326,810 B1 *  12/2001  Keeth .................. 326/83
2002/0021148 A1  2/2002  Goren et al.

FOREIGN PATENT DOCUMENTS

| JP | 09008634 | 1/1997 |
| JP | 2001136057 | 5/2001 |
| JP | 2001251150 | 9/2001 |
| KR | P1998-0040677 | 8/1998 |
| KR | 00026909 | 5/2000 |
| KR | 1020020049200 | 6/2002 |
| KR | 1020030010234 | 2/2003 |

OTHER PUBLICATIONS

Partial European Search Report for European application No. 05 25 1961 mailed on Jul. 1, 2005.
Notice to Submit a Response for Korean Patent Application No. 10-2004-0034287 mailed on Nov. 29, 2005.

* cited by examiner

*Primary Examiner*—Daniel Chang
(74) *Attorney, Agent, or Firm*—Myers Bigel Sibley & Sajovec PA

(57) ABSTRACT

An output driver is responsive to an input signal and a swing width control signal (TE). The output driver is configured to generate an output signal having a first swing width (e.g., less than rail-to-rail) when the swing width control signal designates a normal mode of operation and a second swing width (e.g., rail-to-rail) when the swing width control signal designates a test mode of operation.

15 Claims, 15 Drawing Sheets

US 7,259,592 B2

OUTPUT DRIVERS HAVING ADJUSTABLE SWING WIDTHS DURING TEST MODE OPERATION

REFERENCE TO PRIORITY APPLICATION

This application claims priority to Korean Application Serial Nos. 2004-23339, filed Apr. 6, 2004 and 2004-34287, filed May 14, 2004, the disclosures of which are hereby incorporated herein by reference.

FIELD OF THE INVENTION

The present invention relates to integrated circuit devices and, more particularly, to high speed output driver circuits.

BACKGROUND OF THE INVENTION

A conventional integrated circuit device may include a plurality of output driver circuits that are configured to drive on-chip or off-chip loads at high data rates. These output driver circuits may be single stage devices having a pull-down transistor connected to a pull-up load (e.g., resistor, depletion-mode transistor, etc.). The pull-down transistor may have a gate terminal responsive to an input signal, a drain terminal coupled to an output of the driver circuit and a source terminal coupled to a reference supply line (e.g., Vss). The resistor may be electrically coupled between the output of the driver circuit and a positive power supply line (e.g., Vdd). During operation, the input signal may have a full swing width and thereby swing rail-to-rail between Vss and Vdd. The output signal at the output of the driver circuit may also have a full swing width. One example of a conventional output driver circuit is disclosed in U.S. Pat. No. 6,130,563.

A single stage output driver circuit may utilize a large pull-down transistor in order to drive a high capacitance load with an output signal having a full swing width. Unfortunately, using such a large pull-down transistor to switch an output signal rail-to-rail may limit an operating speed of the output driver circuit. To address this speed limitation, output driver circuits having multiple stages have been developed for high speed applications. In such driver circuits, the signal swing widths of the signals generated at the outputs of one or more of the stages may be smaller to thereby support higher switching rates.

FIG. 1 is an electrical schematic of a conventional output driver circuit 10 having multiple driver stages. These stages are illustrated as an input driver stage 12, an intermediate driver stage 13 and an output driver stage 14. An input buffer 11 (e.g., inverter) is also provided for buffering a data input signal DIN. As illustrated, the input driver stage 12 includes an NMOS pull-down transistor NM1 and a pull-up resistor R1. The gate terminal of the NMOS pull-down transistor NM1 receives a complementary data input signal DINB generated by the input buffer 11. The intermediate driver stage 13 includes an NMOS pull-down transistor NM2 and a pull-up resistor R2. The gate terminal of the NMOS pull-down transistor NM2 is electrically coupled to an output (e.g., drain terminal of NMOS transistor NM1) of the input driver stage 12. The output driver stage 14 includes an NMOS pull-down transistor NM3 and a pull-up/termination resistor R3. The gate terminal of the NMOS pull-down transistor NM3 is electrically coupled to an output (e.g., drain terminal of NMOS transistor NM2) of the intermediate driver stage 13. The value of the pull-up/termination resistor R3 is typically chosen to match a resistance of a load (not shown) being driven by the output DOUT of the output driver stage 14 and thereby inhibit signal reflection at the output DOUT. The resistance values of the pull-up resistors R1 and R2 are typically chosen at relatively small values (e.g., 50 or 75 ohms) so that the swing widths of the signals at the outputs of the input driver stage 12 and the intermediate driver stage 13 are less than rail-to-rail.

As will be understood by those skilled in the art, the swing width of the signal at the output of the input driver stage 12 will range from a maximum voltage of Vdd when the NMOS pull-down transistor NM1 is off to a minimum voltage of $Vdd(R_{NM1}/(R1+R_{NM1}))$ when the NMOS pull-down transistor NM1 is on. The value $R_{NM1}$ designates an on-state resistance of the NMOS pull-down transistor NM1. Because the minimum voltage of the signal at the output of the input driver stage 12 may prevent the NMOS pull-down transistor NM2 from completely turning off, the swing width of the signal at the output of the intermediate driver stage 13 will range from a maximum voltage of less than Vdd to a minimum voltage of $Vdd(R_{NM2}/(R2+R_{NM2}))$ when the NMOS pull-down transistor NM2 is turned on fully. The value $R_{NM2}$ designates an on-state resistance of the NMOS pull-down transistor NM2. The relatively small swing width of the signal at the output of the intermediate driver stage 13 translates to an even smaller swing width of the output signal DOUT.

FIG. 2 is an electrical schematic of a conventional output driver circuit 20 that generates a pair of differential output signals TXN and TXP in response to a pair of differential input signals DP and DN. This output driver circuit 20 includes first and second bias transistors NM13 and NM14, which are responsive to a bias signal Vb, and first and second input transistors NM11 and NM12, which have commonly connected source terminals. The first and second bias transistors NM13 and NM14 operate as current sources that establish first and second pull-down currents I1 and I2. The output driver circuit 20 also includes first and second load resistors R11 and R12, which are coupled to a pair of outputs OUT1 and OUT2. Based on this configuration of the output driver circuit 20, the swing widths of the output signals TXN and TXP will be a function of the values of the load/termination resistors R11 and R12 (e.g., 50 or 75 ohms) and the values of the pull-down currents I1 and I2.

FIG. 3 is an electrical schematic of a conventional input circuit 30 and input signal sampler 40, which generates an input signal IN_DAT. As illustrated, the input circuit 30 includes a pair of termination resistors R21 and R22, a pair of load resistors R31 and R32 and NMOS transistors NM21, NM22 and NM23. The gate terminals of the NMOS transistors NM21 and NM22 receive a pair of differential input signals RXP and RXN at the inputs IN1 and IN2. The NMOS transistor NM23, which is responsive to a clock signal CLK, operates as an enable transistor that determines when the input circuit 30 is active. The signal swing widths of these input signals is influenced by the values of the termination resistors R21 and R22, which may have relatively small values (e.g., 50 or 75 ohms). The drain terminals of the NMOS transistors NM21 and NM22 develop a pair of differential signals, which are provided as inputs to the sampler 40.

Unfortunately, although the generation of signals having relatively small swing widths may increase the operating speeds of driver circuits, these small swing widths may complicate testing of integrated circuits at the wafer level if the swing widths are insufficient to be reliably detected by test equipment. Thus, notwithstanding the performance advantages provided by driver circuits having small swing widths, there continues to be a need for driver circuits that support small swing widths and also support reliable testing at the wafer level.

SUMMARY OF THE INVENTION

An integrated circuit device according to embodiments of the invention includes an output driver responsive to an input signal and a swing width control signal (a/k/a test enable signal TE). The output driver is configured to generate an output signal having a first swing width when the swing width control signal designates a normal mode of operation and a second swing width greater than the first swing width when the swing width control signal designates a test mode of operation. The second swing width may be a rail-to-rail swing width (e.g., Vdd-to-Vss). The output driver may include a driver stage responsive to the input signal and a swing width adjusting circuit responsive to the input signal and the swing width control signal.

These embodiments may also include a multi-stage driver having an output electrically coupled to an input of the output driver. This multi-stage driver is configured to generate the input signal having a less than rail-to-rail swing width. A multi-stage bypass buffer is also provided. This bypass buffer has an output that is electrically coupled to the input of the output driver. The multi-stage bypass buffer is responsive to the swing width control signal and is configured to selectively increase the swing width of the input signal when the swing width control signal designates the test mode of operation. The output of the multi-stage bypass buffer may also be disposed in a high impedance state when the swing width control signal designates a normal mode of operation.

DESCRIPTION OF PREFERRED EMBODIMENTS

Figure 1:
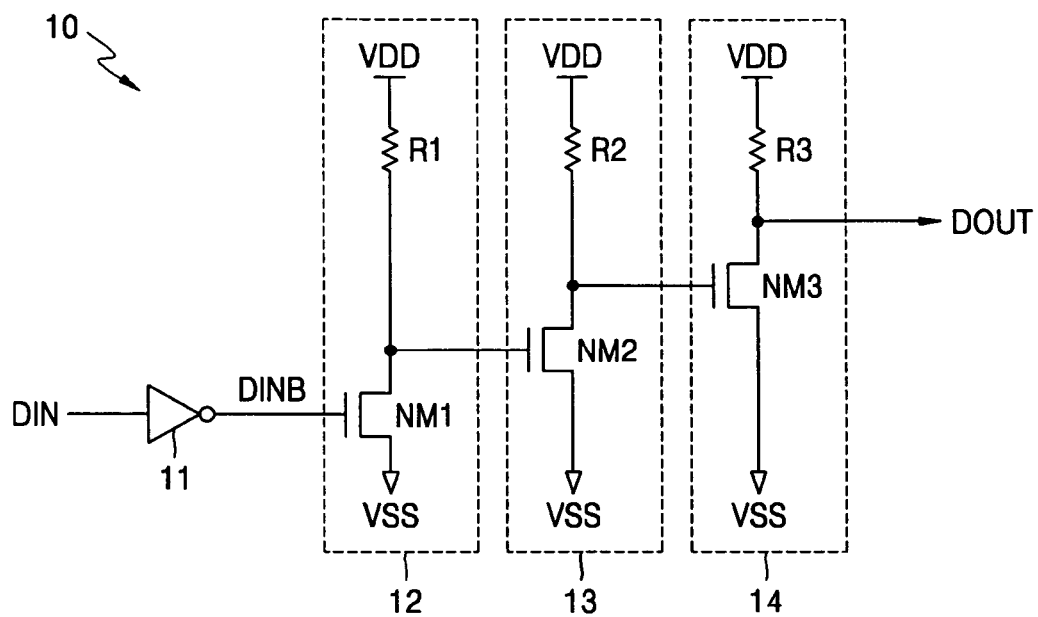
FIG. 1 is an electrical schematic of a conventional output driver circuit having multiple stages.
Figure 2:
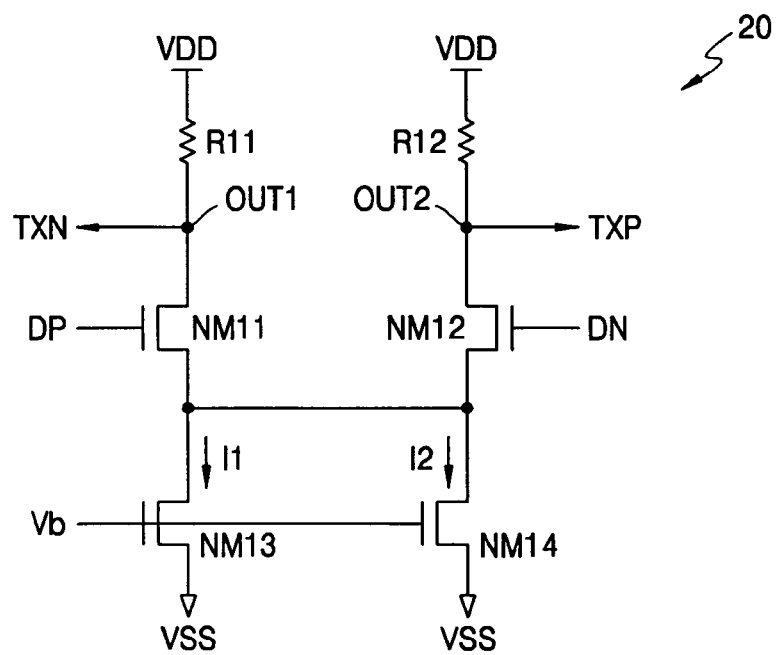
FIG. 2 is an electrical schematic of a conventional output driver circuit that generates a pair of differential output signals.
Figure 3:
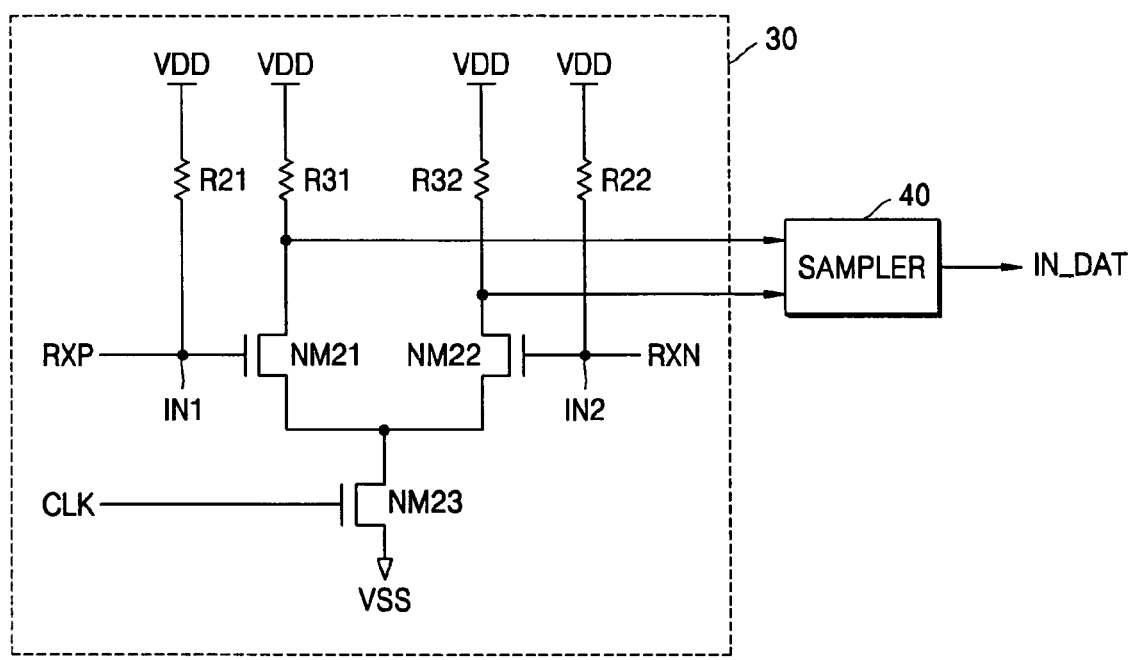
FIG. 3 is an electrical schematic of a conventional input circuit and input signal sampler.

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout and signal lines and signals thereon may be referred to by the same reference characters. Signals may also be synchronized and/or undergo minor boolean operations (e.g., inversion) without being considered different signals. The suffix B (or prefix symbol "/") to a signal name may also denote a complementary data or information signal or an active low control signal, for example.

Figure 4:
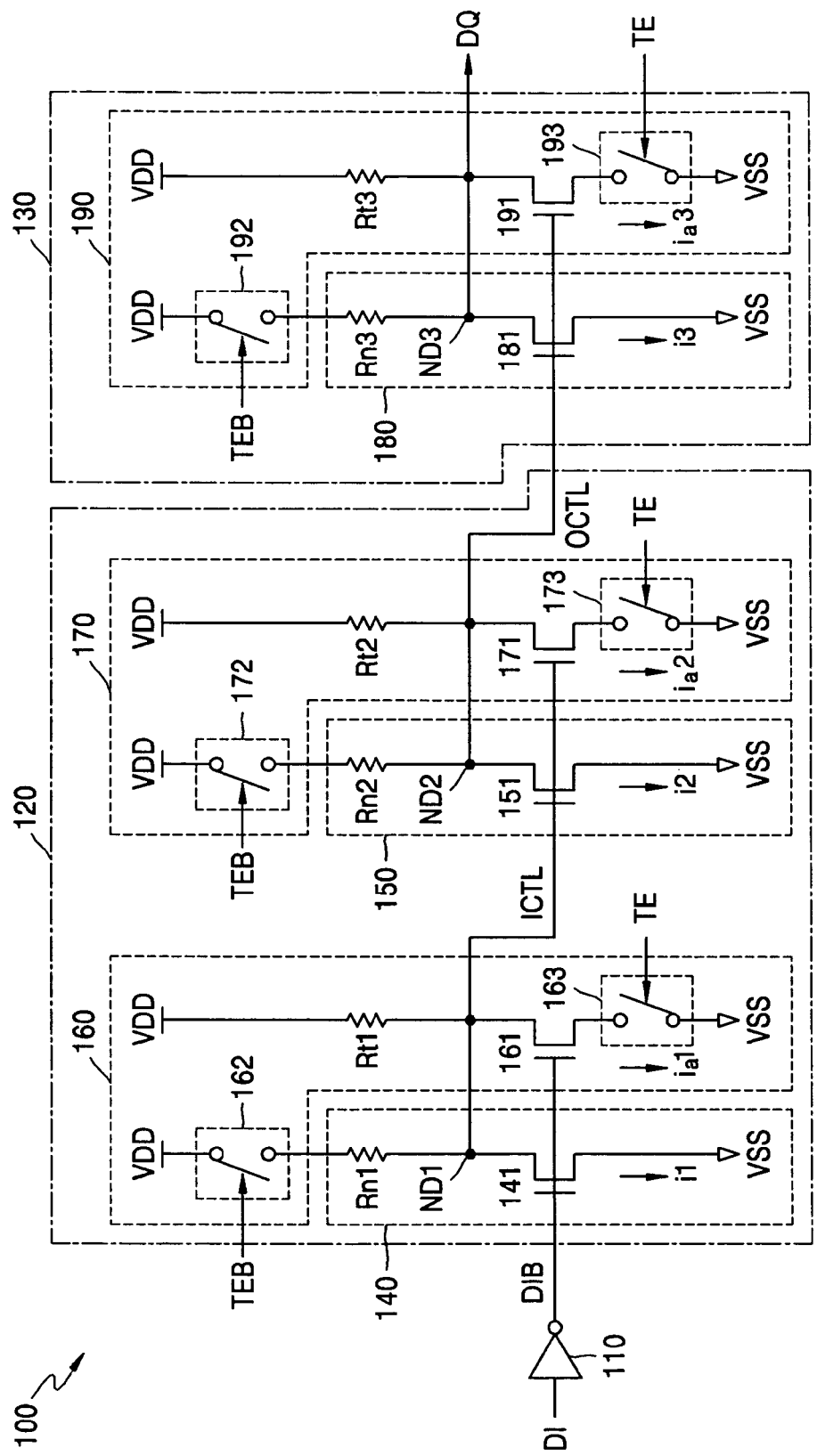
FIG. 4 is an electrical schematic of an output driver having multiple stages, according to embodiments of the present invention.

FIG. 4 is an electrical schematic of a multi-stage output driver circuit 100 according to embodiments of the present invention. This output driver circuit 100 includes a control driver stage 120 and an output driver stage 130. The control driver stage 120 includes an input driver stage and an intermediate driver stage. The input driver stage includes a driver 140 and a swing width adjusting circuit 160 and the intermediate driver stage includes a driver 150 and a swing width adjusting circuit 170. The output driver stage 130 includes a driver 180 and a swing width adjusting circuit 190. A buffer 110 (e.g., inverter) may also be provided for buffering a data input signal DI. The signal generated at an output DIB of the buffer 110 is typically a full swing signal (i.e., swings between Vdd and Vss when switching high and low).

The driver 140 is illustrated as including an NMOS pull-down transistor 141 having a gate terminal connected to the output DIB of the buffer 110 and a source terminal connected to a ground reference line (e.g., Vss=0 Volts). A drain terminal of the NMOS pull-down transistor 141 is connected to an output node ND1 of the driver 140 and a first terminal of a normal mode resistor Rn1. The resistance of the normal mode resistor Rn1 is typically relatively small (e.g., 50 ohms). The swing width adjusting circuit 160 includes an NMOS pull-down transistor 161 having a drain terminal connected to the output node ND1 and a first terminal of a test mode resistor Rt1, which typically has a relatively large value (e.g., 1 K ohms). A second terminal of the test mode resistor Rt1 is connected to a power supply line (e.g., Vdd). The swing width adjusting circuit 160 also includes a first switching element 162 and a second switching element 163, connected as illustrated. The first switching element 162 is responsive to a complementary test enable signal TEB, which may be treated herein as an inverted swing width control signal. The second switching element 163 is responsive to a true test enable signal TE, which may be treated herein as a true swing width control signal.

When the true test enable signal TE is inactive (i.e., TE=0 and TEB=1), the first switching element 162 will be closed and the second switching element 163 will be open. The closure of the first switching element 162 will cause the normal mode resistor Rn1 and the test mode resistor Rt1 to be in parallel with each other. When this parallel relationship is present, the effective resistance between the output node ND1 and the power supply line Vdd will be approximately equal to the resistance of the normal mode resistor Rn1 for the case where Rn1<<Rt1. Accordingly, setting the true test enable signal TE to an inactive level during normal mode operation will cause the control signal ICTL at the output node ND1 to have a smaller swing width relative to the signal DIB at the output of the buffer 110. In particular, when the signal DIB switches low-to-high (e.g., Vss-to-Vdd), the NMOS pull-down transistor 141 will turn on fully and sink a pull-down current of i1 through the parallel combination of the normal and test mode resistors Rn1 and Rt1. In response, the output node ND1 will be pulled low to a value equal to $Vdd(R_{141}/((Rn1\|Rt1)+R_{141}))$, where the resistance value $R_{14}$, designates a fully on-state resistance of the NMOS pull-down transistor 141 and the value (Rn1∥Rt1) represents the combined parallel resistance of the normal and test mode resistors Rn1 and Rt1. In contrast, when the signal DIB switches high-to-low (e.g., Vdd-to-Vss), the NMOS pull-down transistor 141 will turn off fully and the output node ND1 will be pulled high to a value equal to about Vdd. The swing width of the control signal ICTL may be about 1.2 Volts for the case where Vdd equals 1.8 Volts and $Vdd(R_{141}/((Rn1\|Rt1)+R_{141}))$ equals about 0.6 Volts.

However, during a test mode of operation, the true test enable signal TE will be active and the complementary test enable signal TEB will be inactive (i.e., TE=1 and TEB=0). When this occurs, the first switching element 162 will be open and the second switching element 163 will be closed and the swing width of the control signal ICTL will increase to about 1.8 Volts (i.e., full rail-to-rail) for the case where Vdd equals 1.8 Volts. In particular, closing the second switching element 163 will cause the parallel pull-down resistance of the NMOS pull-down transistors 141 and 161 to be very small when the signal DIB switches low-to-high and a combined sink current of i1+ia1 is pulled through the relatively large test mode resistor Rt1. Using conventional voltage division rules, the control signal ICTL will switch to a low level of about Vss when the signal DIB switches low-to-high and switch to a high level of about Vdd when the signal DIB switches high-to-low and the NMOS pull-down transistors 141 and 161 are turned off. Accordingly, setting the true test enable signal TE to an active level and the complementary test enable signal TEB to an inactive level during a test mode of operation will cause the swing width adjusting circuit 160 to increase the swing width of the control signal ICTL to a full rail-to-rail level (e.g., increase the swing width from about 1.2 Volts during normal mode to about 1.8 Volts during test mode for the case where Vdd=1.8 Volts).

The above-description of the operation of the input driver stage also applies to the intermediate driver stage, which includes the driver 150 and swing width adjusting circuit 170. The driver 150 is illustrated as including an NMOS pull-down transistor 151 having a gate terminal connected to the output ICTL of the input driver stage and a source terminal connected to the ground reference line (e.g., Vss). A drain terminal of the NMOS pull-down transistor 151 is connected to an output node ND2 of the driver 150 and a first terminal of a normal mode resistor Rn2. The resistance of the normal mode resistor Rn2 is typically relatively small (e.g., 50 ohms). The swing width adjusting circuit 170 includes an NMOS pull-down transistor 171 having a drain terminal connected to the output node ND2 and a first terminal of a test mode resistor Rt2, which typically has a relatively large value (e.g., 1 K ohms). A second terminal of the test mode resistor Rt2 is connected to the power supply line (e.g., Vdd). The swing width adjusting circuit 170 also includes a first switching element 172 and a second switching element 173, connected as illustrated. The first switching element 172 is responsive to the complementary test enable signal TEB. The second switching element 173 is responsive to the true test enable signal TE.

When the true test enable signal TE is inactive (i.e., TE=0 and TEB=1), the first switching element 172 will be closed and the second switching element 173 will be open. The closure of the first switching element 172 will cause the normal mode resistor Rn2 and the test mode resistor Rt2 to be in parallel with each other. When this parallel relationship is present, the effective resistance between the output node ND2 and the power supply line Vdd will be approximately equal to the resistance of the normal mode resistor Rn2 for the case where Rn2<<Rt2. Accordingly, setting the true test enable signal TE to an inactive level during normal mode operation will cause the control signal OCTL at the output node ND2 to have a smaller swing width relative to the control signal ICTL at the output of the input driver stage. In particular, when the control signal ICTL switches low-to-high, the NMOS pull-down transistor 151 will turn on fully and sink a pull-down current of i2 through the parallel combination of the normal and test mode resistors Rn2 and Rt2. In response, the output node ND2 will be pulled low to a value equal to $Vdd(R_{151}/((Rn2\|Rt2)+R_{151}))$, where the resistance value $R_{151}$ designates a fully on-state resistance of the NMOS pull-down transistor 151 and the value (Rn2∥Rt2) represents the combined parallel resistance of the normal and test mode resistors Rn2 and Rt2. In contrast, when the control signal ICTL switches low to a level equal to about $Vdd(R_{141}/((Rn1\|Rt1)+R_{141}))$, the NMOS pull-down transistor 151 will turn off partially and the output node ND2 will be pulled high to a value less than Vdd. Accordingly, during a normal mode of operation, the swing width of the control signal OCTL at the output of the intermediate driver stage will be less than the swing width of the control signal ICTL at the output of the input driver stage.

However, during a test mode of operation, the true test enable signal TE will be active and the complementary test enable signal TEB will be inactive (i.e., TE=1 and TEB=0). When this occurs, the first switching element 172 will be open and the second switching element 173 will be closed and the swing width of the control signal OCTL (and control signal ICTL) will increase to about 1.8 Volts (i.e., full rail-to-rail) for the case where Vdd equals 1.8 Volts. In particular, closing the second switching element 173 will cause the parallel pull-down resistance of the NMOS pull-down transistors 151 and 171 to be very small when the control signal ICTL switches low-to-high and a combined sink current of i2+ia2 is pulled through the relatively large test mode resistor Rt2. Using conventional voltage division rules, the control signal OCTL will switch to a low level of about Vss when the control signal ICTL switches low-to-high or switch to a high level of about Vdd when the control signal ICTL switches high-to-low and the NMOS pull-down transistors 151 and 171 are turned off.

The control signal OCTL is provided as an input to the driver 180 within the output driver stage 130. This driver 180 includes a NMOS pull-down transistor 181 having a source terminal connected to the ground reference line Vss and a drain terminal connected to an output node ND3, the output DQ of the multi-stage output driver circuit 100 and a first terminal of a normal mode termination resistor Rn3. The swing width adjusting circuit 190 includes a NMOS pull-down transistor 191 having a drain terminal connected to the output node ND3 and a first terminal of a test termination resistor Rt3, which typically has a relatively large value (e.g., 1 K ohms). A second terminal of the test mode termination resistor Rt3 is connected to the power supply line (e.g., Vdd). The swing width adjusting circuit 190 also includes a first switching element 192 and a second switching element 193, connected as illustrated. When the true test enable signal TE is inactive (i.e., TE=0 and TEB=1), the resistors Rn3 and Rt3 will operate in parallel and the driver 180 will generate an output signal DQ having a smaller swing width relative to the swing width of the control signal OCTL. However, when the true test enable signal TE is active (i.e., TE=1 and TEB=0), the control signals ICTL and OCTL and the output signal DQ will all have full swing widths similar to the signals DI and DIB and the sink currents i3 and ia3 will be pulled through the test termination resistor Rt3.

Accordingly, FIG. 4 illustrates an output driver 130 responsive to an input signal (e.g., OCTL) and a swing width control signal, which is described herein as a test enable signal TE. The output driver 130 is configured to generate an output signal DQ having a first swing width when the swing width control signal TE designates a normal mode of operation and a second swing width greater than the first swing width when the swing width control signal TE designates a test mode of operation. The second swing width may be a rail-to-rail swing width (e.g., Vdd-to-Vss). The output driver may include a driver stage 180 responsive to the input signal and a swing width adjusting circuit 190 responsive to the input signal (OCTL) and the swing width control signal TE.

Figure 5:
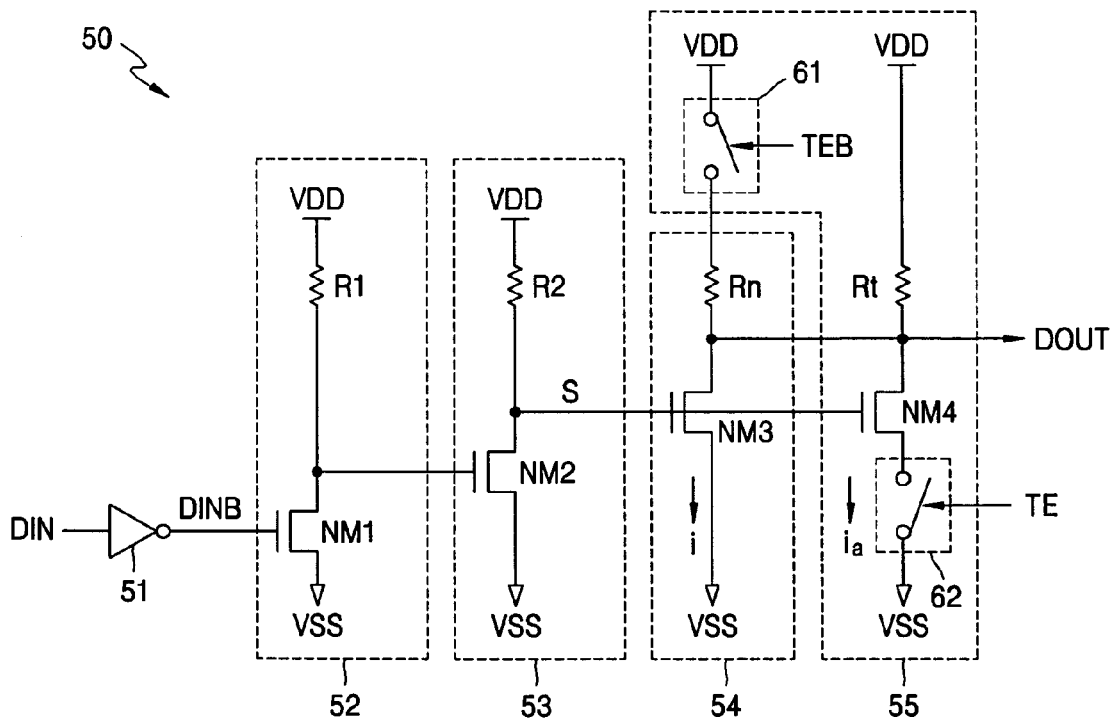
FIG. 5 is an electrical schematic of an output driver having an output driver stage configured according to embodiments of the present invention.

In contrast to the multi-stage output driver circuit 100 of FIG. 4, the multi-stage output driver circuit 50 of FIG. 5 includes only one swing width adjusting circuit 55 that is responsive to a test enable signal during test mode operation. In particular, the output driver circuit 50 of FIG. 5 includes a buffer 51 that generates a complementary data input signal DINB in response to a data input signal DIN. A first stage of the output driver circuit 50 includes a first driver 52 containing an NMOS pull-down transistor NM1 and a pull-up resistor R1, connected as illustrated. A signal developed at a drain terminal of the NMOS pull-down transistor NM1 is provided as an input to a second driver 53. This second driver 53 contains an NMOS pull-down transistor NM2 and a pull-up resistor R2, connected as illustrated. A signal S developed at a drain terminal of the NMOS pull-down transistor NM2 is provided as an input to a third driver 54 and swing width adjusting circuit 55. As will be understood by those skilled in the art, the signal S will have a smaller swing width relative to the data input signal DIN, which may switch at full CMOS levels (e.g., full rail-to-rail).

As illustrated, the third driver 54 includes an NMOS pull-down transistor NM3 and a normal resistor Rn and the swing width adjusting circuit 55 includes an NMOS pull-down transistor NM4, a test termination resistor Rt, a first switching element 61 and a second switching element 62. The first and second switching elements 61 and 62 are responsive to the true and complementary test enable signals TE and TEB, respectively. As described above, setting the test enable signal TE to an active level (i.e., TE=1 and TEB=0) will operate to increase the swing width of the data output signal DOUT relative to the swing width of the signal S provided as an input to the third driver 54. However, because the signal S does not have a full swing width when the test enable signal TE is active, the data output signal DOUT cannot achieve a full swing width even when a swing width adjustment provided by the swing width adjusting circuit 55 is taken into account.

Figure 6:
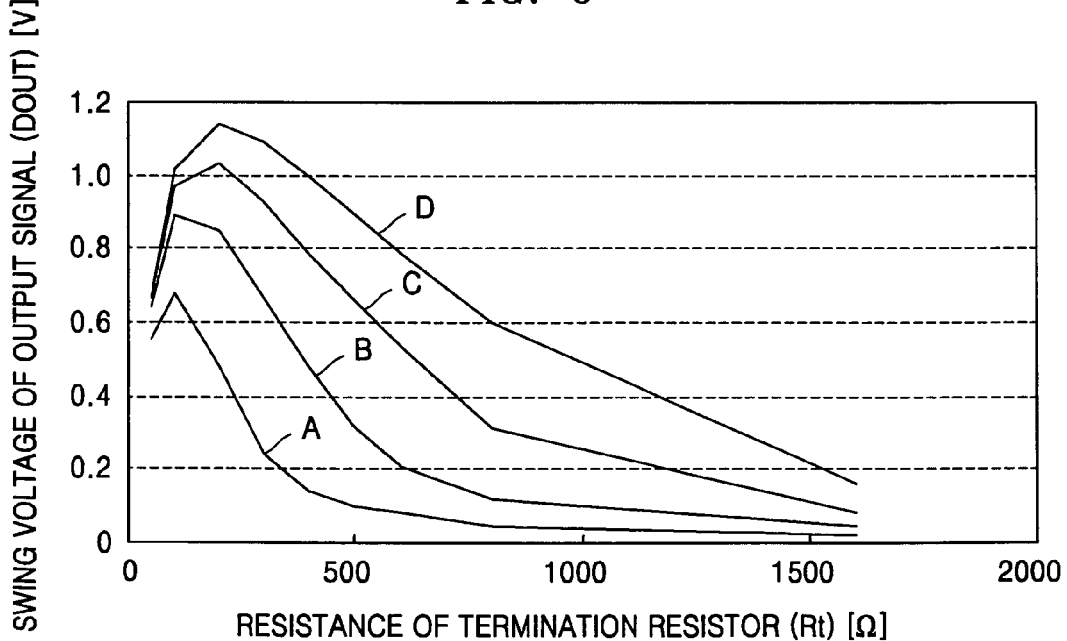
FIG. 6 is a graph showing signal swing widths versus termination resistance for the output driver of FIG. 5.

This failure of the data output signal DOUT to achieve a full swing width is illustrated by the graph of FIG. 6. In particular, FIG. 6 is a graph containing four curves A, B, C and D. The y-axis of the graph specifies the swing width of the data output signal DOUT and the x-axis of the graph specifies the resistance value of the test termination resistor Rt within the swing width adjusting circuit 55. The curve A corresponds shows the swing width of the data output signal DOUT as a function of the resistance of the test termination resistor Rt, for the case where a resistor R2 within the driver 53 has a first value. The curve B corresponds shows the swing width of the data output signal DOUT as a function of the resistance of the test termination resistor Rt, for the case where a resistor R2 within the driver 53 has a second value greater than the first value. The curve C corresponds shows the swing width of the data output signal DOUT as a function of the resistance of the test termination resistor Rt, for the case where a resistor R2 within the driver 53 has a third value greater than the second value. The curve D corresponds shows the swing width of the data output signal DOUT as a function of the resistance of the test termination resistor Rt, for the case where a resistor R2 within the driver 53 has a fourth value greater than the third value.

Figure 7:
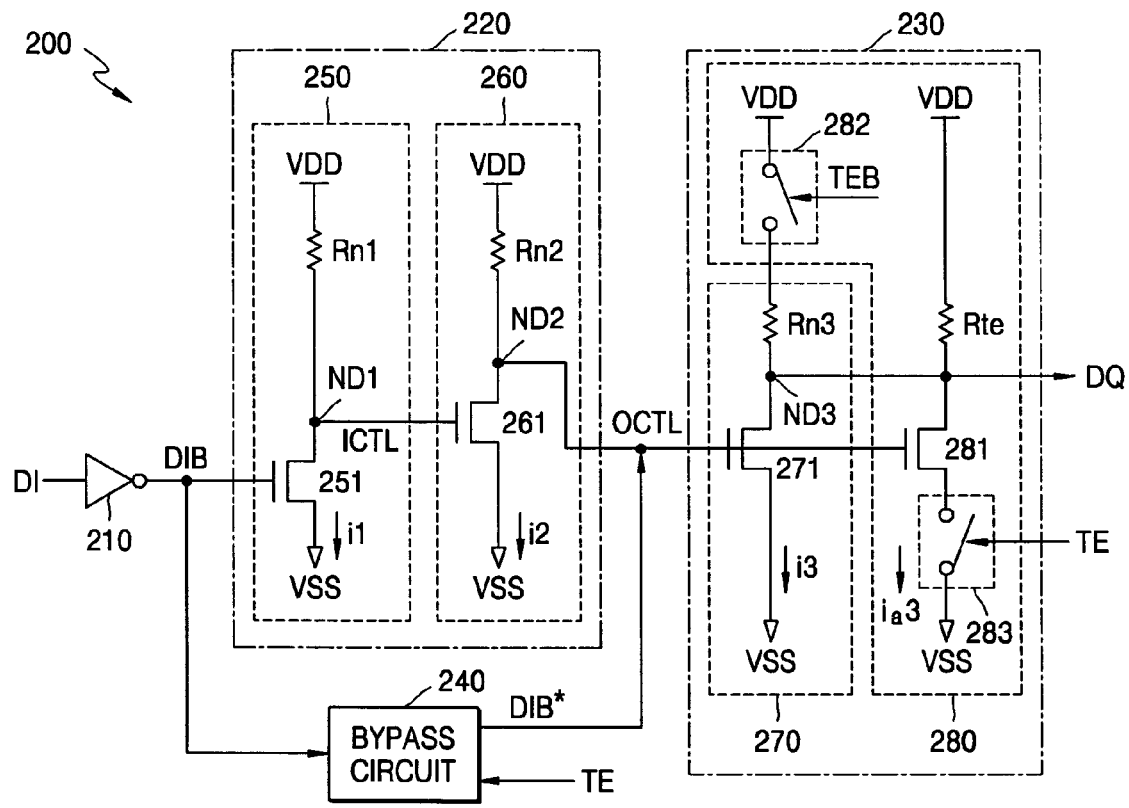
FIG. 7 is an electrical schematic of an output driver and bypass circuit according to additional embodiments of the present invention.

To address the limitations described above with respect to the multi-stage output driver circuit 50 of FIG. 5, a multi-stage output driver 200 according to another embodiment of the present invention includes a bypass circuit 240, which operates to increase a swing width of a signal (e.g., OCTL) provided as an input to an output driver stage 230 during test mode operation. As illustrated by FIG. 7, the output driver 200 includes a buffer 210 (optional), a control driver stage 220, an output driver stage 230 and a bypass circuit 240. The control driver stage 220 includes an input driver stage 250 and an intermediate driver stage 260. The output driver stage 230 includes an output driver 270 and a swing width adjusting circuit 280.

The buffer 210 generates a complementary data input signal DIB in response to a true data input signal DI. The complementary data input signal DIB may have a full swing width established at CMOS levels. The input driver stage 250 includes an NMOS pull-down transistor 251 and a normal mode resistor Rn1, connected as illustrated. An output node ND1 of the input driver stage 250 generates a control signal ICTL, which is provided as an input to the intermediate driver stage 260. When the NMOS pull-down transistor 251 is turned on, a pull-down current i1 will pass through the normal mode resistor Rn1. The intermediate driver stage 260 includes an NMOS pull-down transistor 261 and a normal mode resistor Rn2, connected as illustrated. An output node ND2 of the intermediate driver stage 260 generates a control signal OCTL, which is provided as an input to the output driver 270. When the NMOS pull-down transistor 261 is turned on, a pull-down current i2 will pass through the normal mode resistor Rn2. This control signal OCTL has relatively small swing width properties similar to the signal S illustrated in FIG. 5 during normal mode operation. However, during test mode operation, the swing width of the control signal OCTL is increased to a full rail-to-rail value by the bypass circuit 240.

Figure 8:
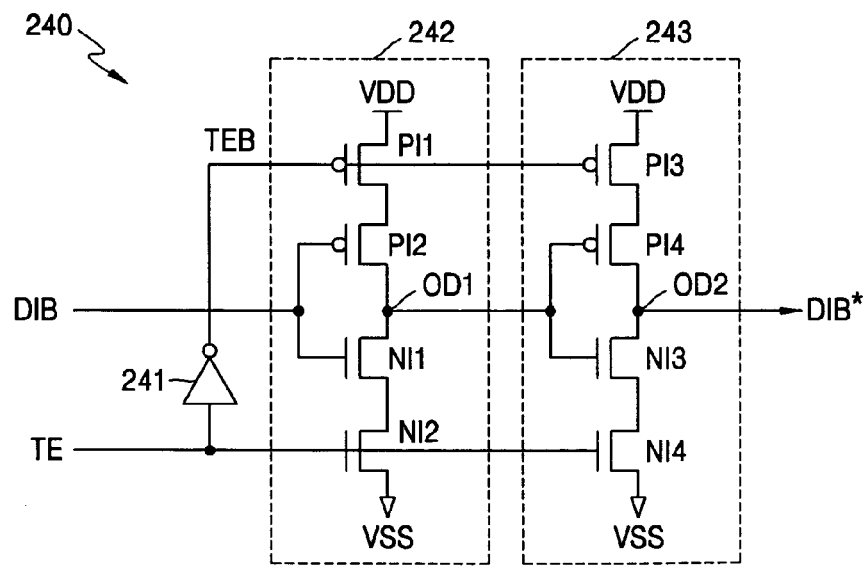
FIG. 8 is an electrical schematic of the bypass circuit of FIG. 7.

As illustrated by FIG. 8, this bypass circuit 240 includes an inverter 241, a first bypass stage 242 and a second bypass stage 243. The first and second bypass stages 242 and 243 provide a double buffering of the complementary data input signal DIB generated by the buffer 210 when the test enable signal TE is active (i.e., TE=1 and TEB=0). Alternatively, the first and second bypass stages 242 and 243 are disabled when the test enable signal TE is inactive. When disabled, the second bypass stage 243 generates a high impedance output (i.e., DIB*=high Z). The first bypass stage 242 includes a totem pole arrangement of two PMOS transistors P11 and P12 and two NMOS transistors N11 and N12. When the test enable signal TE is active, the first bypass stage 242 operates as a CMOS inverter, which means an output node OD1 of the first bypass stage 242 switches rail-to-rail in response to the complementary data input signal DIB. Similarly, the second bypass stage 243 includes a totem pole arrangement of two PMOS transistors P13 and P14 and two NMOS transistors N13 and N14. When the test enable signal TE is active, the second bypass stage 243 operates as a CMOS inverter, which means a double buffered complementary data input signal DIB* at node OD2 switches rail-to-rail. Moreover, because the total delay provided by the first and second bypass stages 242 and 243 is about equal to the total delay provided by the input and intermediate driver stages 250 and 260 during test mode operation, the control signal OCTL will be pulled rail-to-rail by the double buffered complementary data input signal DIB*.

Accordingly, during test mode operation when the test enable TE signal is active, the swing width of the control signal OCTL will increase to a full rail-to-rail level. Moreover, the swing width adjusting circuit 280 will be active to support a full swing width of the output signal DQ. In particular, increasing the swing width of the control signal OCTL will cause the NMOS pull-down transistor 271 to turn on fully when the control signal OCTL switches low-to-high or turn off fully when the control signal OCTL switches high-to-low. Setting the test enable signal to an active level will also cause the switch element 283 to close and the switch element 281 to open and thereby block current conduction through the normal resistor Rn3. When the NMOS pull-down transistors 271 and 281 are turned on fully in response to a low-to-high transition of the control signal OCTL, the currents i3 and ia3 will be pulled through the test termination resistor Rte and the node ND3 and output terminal DQ will be driven to a ground reference voltage Vss. Alternatively, when the NMOS pull-down transistors 271 and 281 are turned off fully in response to a high-to-low transition of the control signal OCTL, the node ND3 and the output terminal DQ will be pulled high to a power supply voltage Vdd. In this manner, the bypass circuit 240 of FIGS. 7-8 may be provided as a substitute for the swing width adjusting circuits 160 and 170 of FIG. 4.

Accordingly, FIGS. 7-8 illustrate an output driver 230 responsive to an input signal (OCTL) and a swing width control signal TE. The output driver 230 is configured to generate an output signal DQ having a first swing width when the swing width control signal designates a normal mode of operation and a second swing width greater than the first swing width when the swing width control signal designates a test mode of operation. A multi-stage driver 220 is also provided. The multi-stage driver 220 has an output electrically coupled to an input of the output driver 230. The multi-stage driver 220 is configured to generate the input signal OCTL having a less than rail-to-rail swing width. A multi-stage bypass buffer 240 is also provided. The multi-stage bypass buffer 240 is electrically coupled to the input of the output driver 230 and is responsive to the swing width control signal TE. The multi-stage bypass buffer 220 is configured to selectively increase the swing width of the input signal OCTL when the swing width control signal designates the test mode of operation. The output driver 230 includes a driver stage 270 responsive to the input signal OCTL and a swing width adjusting circuit 280 responsive to the input signal OCTL and the swing width control signal TE. The swing width adjusting circuit 280 includes at least one switching element 283 responsive to the swing width control signal TE.

Figure 9:
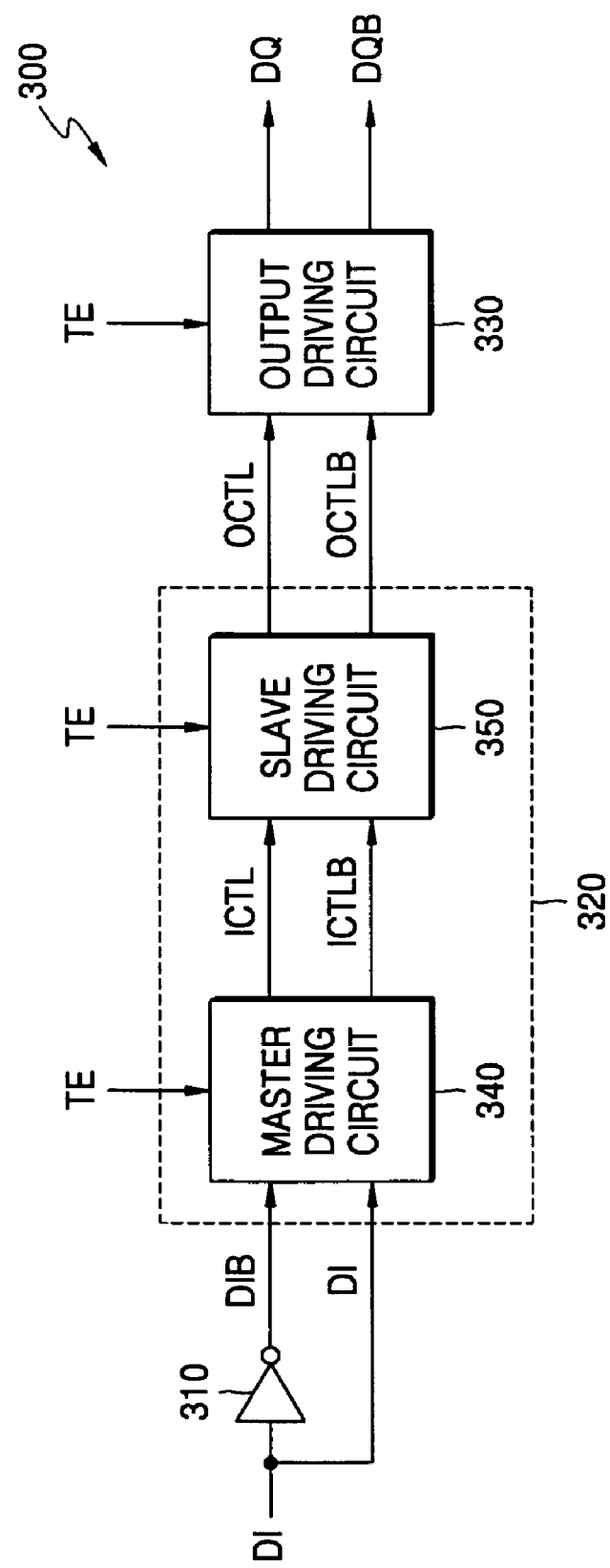
FIG. 9 is an electrical schematic of a differential output driver having multiple stages, according to embodiments of the present invention.

Referring now to FIG. 9, a multi-stage output driver 300 according to additional embodiments of the invention is similar to the output driver 100 of FIG. 4, however, each of the stages of the output driver 300 processes a respective pair of differential signals instead of a single signal. These differential signals are illustrated as (DI, DIB), (ICTL, ICTLB), (OCTL, OCTLB) and (DQ, DQB). In particular, the multi-stage output driver 300 includes a buffer 310 (optional), a control driver stage 320 and an output driver stage 330. The control driver stage 320 includes an input driver stage 340, shown as a master driver, and an intermediate driver stage 350, shown as a slave driver. The master driver 340 generates a pair of control signals ICTL and ICTLB in response to a pair of data input signals DI and DIB. The slave driver 350 generates a pair of control signals OCTL and OCTLB in response to the pair of control signals ICTL and ICTLB. The output driver stage 330 generates a pair of data output signals DQ and DQB in response to the control signals OCTL and OCTLB. The master driver 340, the slave driver 350 and the output driver stage 330 are all responsive to a test enable signal TE and may be configured as equivalent circuits. When the test enable signal TE is set to an active level during a test mode of operation, the signals ICTL, ICTLB, OCTL, OCTLB, DQ and DQB will be switched rail-to-rail and thereby have full swing widths to support wafer level and other types of testing. In contrast, when the test enable signal TE is set to an inactive level during normal mode operation, the signals ICTL, ICTLB, OCTL, OCTLB, DQ and DQB will have less than full swing widths, which supports high speed switching.

Figure 10:
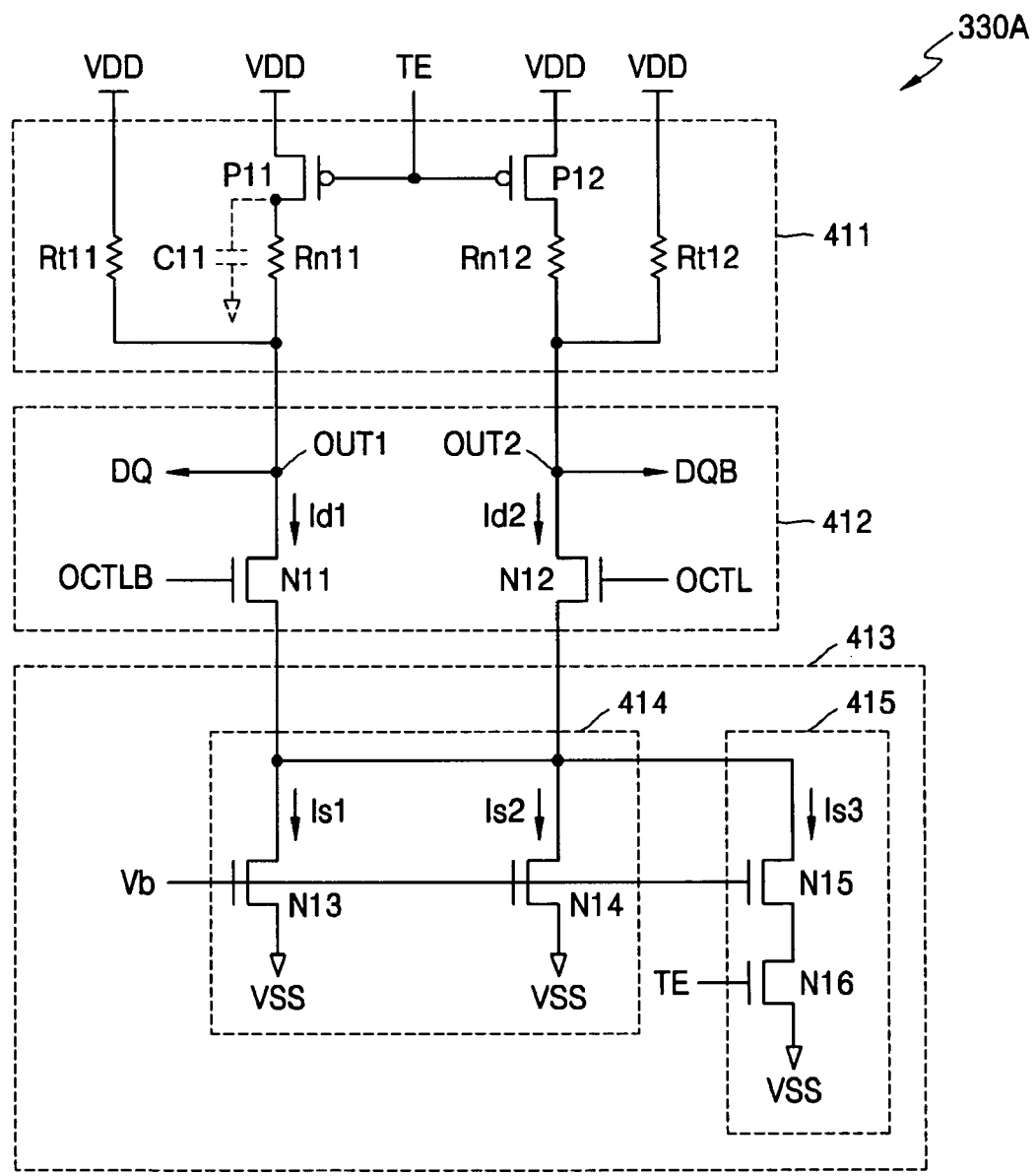
FIG. 10 is an electrical schematic of an embodiment of the differential output driver stage of FIG. 9.

FIGS. 10-14 illustrate five alternative embodiments of the output driver stage 330 (and equivalent master and slave drivers) of FIG. 9. In particular, FIG. 10 is an electrical schematic of an output driver 330A containing a load circuit 411, a comparing circuit 412 and a current source circuit 413 containing a primary current source 414 and a secondary current source 415. The load circuit 411 is illustrated as including a pair of termination resistors Rt11 and Rt12, which may have large resistances of about 1 K ohms, and a pair of normal mode resistors Rn11 and Rn12, which may have relatively small resistances of about 50 ohms, for example. PMOS pull-up transistors P11 and P12 are also provided. These pull-up transistors P11 and P12 are responsive to a test enable signal TE. When the test enable signal TE is set to an active level (i.e., TE=1), the PMOS pull-up transistors P11 and P12 are turned off and the normal mode resistors Rn11 and Rn12 are blocked from influencing a pull-up impedance of the load circuit 411. However, when the test enable signal TE is set to an inactive level (i.e., TE=0), the PMOS pull-up transistors P11 and P12 are turned on. When this occurs, the combined parallel resistance of the normal mode resistor Rn11 and termination resistor Rt11 is approximately equal to the resistance of the normal mode resistor Rn11. Similarly, the combined parallel resistance of the normal mode resistor Rn12 and termination resistor Rt12 is approximately equal to the resistance of the normal mode resistor Rn12.

The comparing circuit 412 is illustrated as including NMOS input transistors N11 and N12 having commonly connected source terminals. These input transistors N11 and N12 are responsive to the control signals OCTL and OCTLB. The drain terminals of the NMOS input transistors N11 and N12 are connected to the output nodes OUT1 and OUT2, which produce the pair of output signals DQ and DQB. As will be understood by those skilled in the art, when the control signal OCTL is set high to Vdd and the control signal OCTLB is set low to Vss, the current Id2 will be pulled down from the right side of the load circuit 411. Alternatively, when the control signal OCTLB is set high to Vdd and the control signal OCTL is set low to Vss, the current Id1 will be pulled down from the left side of the load circuit 411.

The primary current source 414 includes a pair of NMOS pull-down transistors N13 and N14, which are responsive to a bias voltage Vb. The sinking currents Is1 and Is2 are provided through the pull-down transistors N13 and N14. The secondary current source 415 includes NMOS transistors N15 and N16. NMOS transistor N15 is responsive to the bias signal Vb and NMOS transistor N16 is responsive to the test enable signal TE. Based on this configuration of the secondary current source 415, the pull-down current Is3 will be added to the sinking currents Is1 and Is2 only during the test mode of operation when the test enable signal TE is active.

Accordingly, the output driver 330A is configured so that the output signals DQ and DQB will have relatively small swing widths when the control signals OCTL and OCTLB, which have somewhat larger swing widths, are switching during normal mode operation. During this normal mode of operation, the output driver 330A operates as a differential amplifier having input transistors N11 and N12, a primary current source 414 which is commonly connected to the source terminals of the input transistors N11 and N12 and parallel load impedances ((Rn11∥Rt11) and (Rn12∥Rt12)), which are approximately equal to the values of the normal mode resistors Rn11 and Rn12, respectively, for the case where Rn11<<Rt11 and Rn12<<Rt12. In contrast, during the test mode of operation when the test enable signal TE is active, the swing widths of the control signals OCTL and OCTLB will be rail-to-rail signals and the normal mode resistors Rn11 and Rn12 will be disconnected from the pull-up paths within the load circuit 411 because the PMOS pull-up transistors P11 and P12 will be turned off. In addition, the secondary current source 415 will be active to increase the total pull-down current provided by the current source circuit 413. This additional current supports an increase in the swing widths of the output signals DQ and DQB when the NMOS input transistors N11 and N12 are alternatively turned on and off in response to the control signals OCTL and OCTLB.

The switching speed of the output driver 330A of FIG. 10 during the normal mode of operation is influenced by the parasitic gate-to-drain capacitances of the PMOS transistors P11 and P12. The capacitor C11, shown with dotted lines, reflects the parasitic capacitance of the PMOS transistor P11 and the PMOS transistor P12 has a similar parasitic capacitance (not shown). Maintaining these parasitic capacitance values at relatively low levels can improve the switching speed of the output driver 330A by reducing the RC time constant associated with the RC network defined by resistors Rt11, Rn11 and PMOS transistor P11 and the RC network defined by resistors Rt12, Rn12 and PMOS transistor P12.

Figure 11:
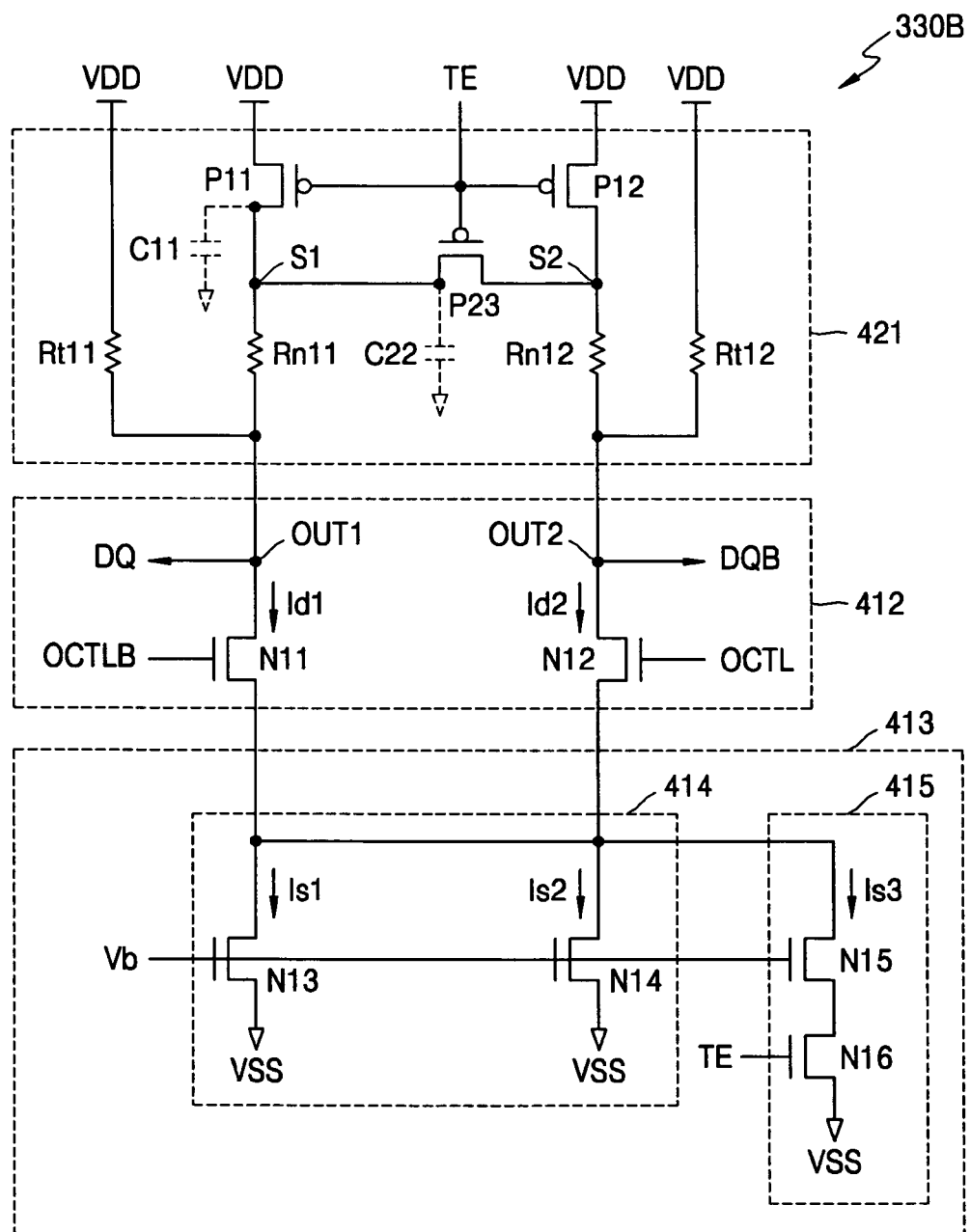
FIG. 11 is an electrical schematic of an embodiment of the differential output driver stage of FIG. 9.

FIG. 11 illustrates an output driver 330B according to another embodiment of the present invention. This output driver 330B is similar to the output driver 330A of FIG. 10, however, a modified load circuit 421 is provided. This modified load circuit 421 includes an additional PMOS transistor P23 having source and drain terminals connected to nodes S1 and S2. The parasitic capacitance associated with a drain terminal of the PMOS transistor P23 is illustrated as capacitor C22, which is shown with dotted lines. Although not shown, a source terminal of the PMOS transistor P23 and a drain terminal of the PMOS transistor P12 also have parasitic capacitances. When the test enable signal TE is set to an inactive level during a normal mode of operation, which may include high speed switching of the output driver 330B, the nodes S1 and S2 are electrically shorted together and to the power supply lines Vdd. When this occurs, the resistors Rt11, Rt12, Rn11 and Rn12 and the parasitic capacitors can be treated as a connected RC load network that supports higher speed switching relative to the load network within the load circuit 411 of FIG. 10. However, during a test mode of operation when the test enable signal TE is active (i.e., TE=1), the RC load network in the load circuit 421 will provide somewhat higher parasitic capacitance (because of the addition of the MOS transistor P23) and somewhat slower switching speed characteristics relative to the load network within the load circuit 411 of FIG. 10.

Figure 12:
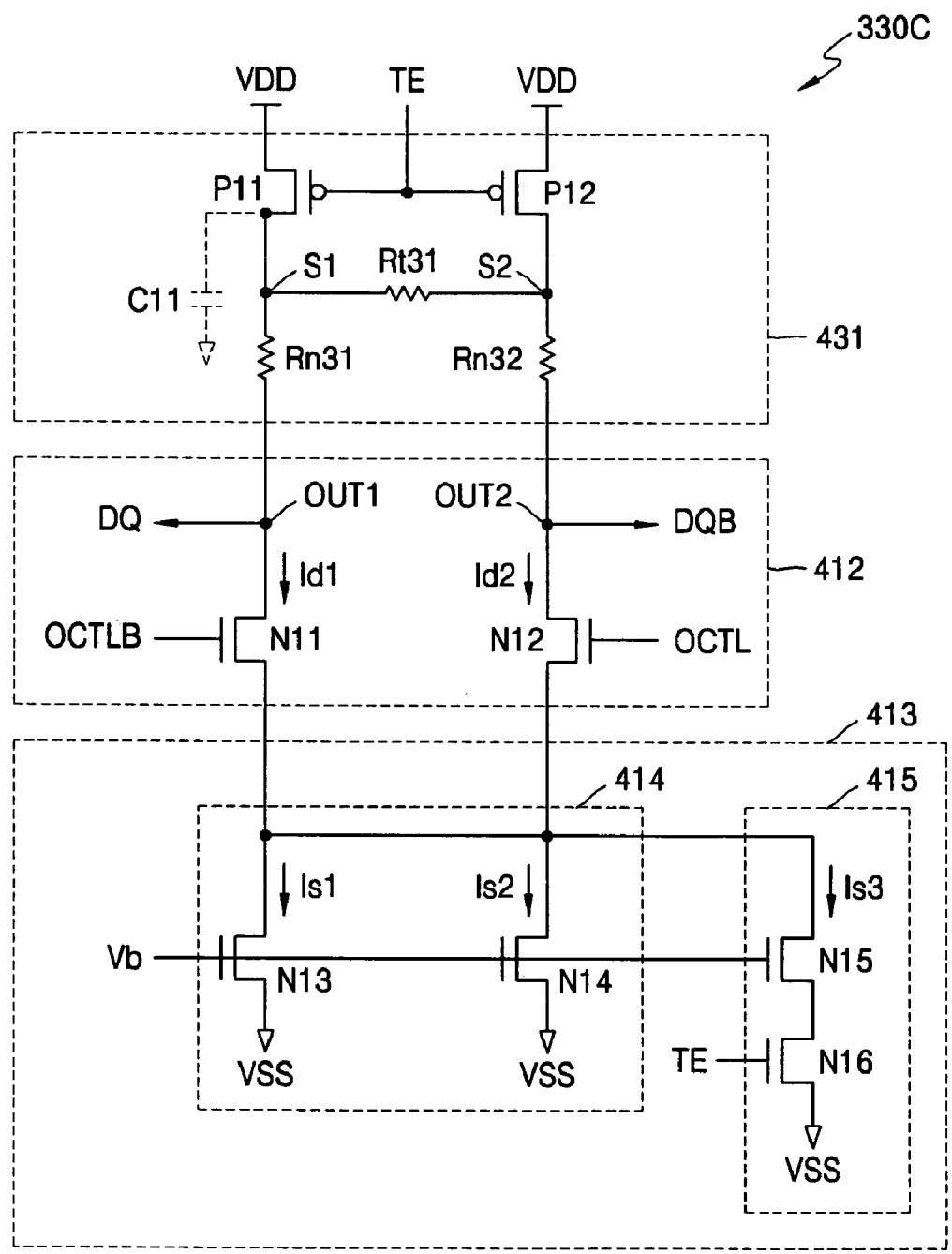
FIG. 12 is an electrical schematic of an embodiment of the differential output driver stage of FIG. 9.

FIG. 12 illustrates an output driver 330C according to another embodiment of the present invention. This output driver 330C is similar to the output driver 330A of FIG. 10, however, a modified load circuit 431 is provided. This modified load circuit 431 includes an additional test mode resistor Rt31 connected to nodes S1 and S2, but is missing the termination resistors Rt11 and Rt12 shown in FIG. 10. During a normal mode of operation when the test enable signal TE is inactive, the load circuit 431 is active to connect the normal resistors Rn31 and Rn32 to the power supply line Vdd and equilibrate the voltages at nodes S1 and S2 so that relatively little current passes through the test mode resistor Rt31. Alternatively, during a test mode of operation when the test enable signal TE is active, the PMOS transistors P11 and P12 are turned off and a power supply voltage Vdd is applied to the load circuit 431 by an external test circuit connected to the output nodes OUT1 and OUT2.

Figure 13:
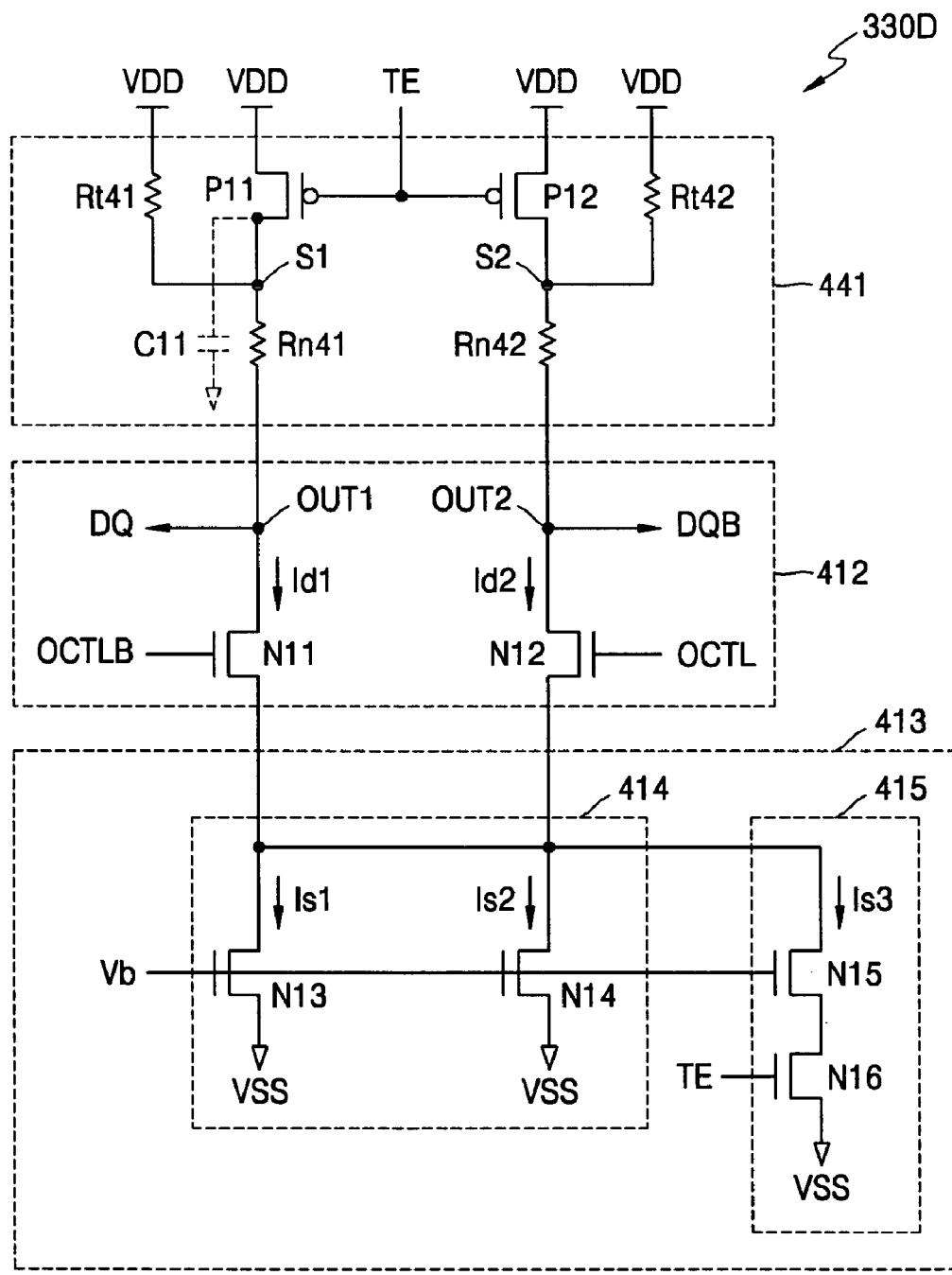
FIG. 13 is an electrical schematic of an embodiment of the differential output driver stage of FIG. 9.

FIG. 13 illustrates an output driver 330D according to another embodiment of the present invention. This output driver 330D is similar to the output driver 330A of FIG. 10, however, the termination resistors Rt41 and Rt42 in the load circuit 441 are connected to nodes S1 and S2 instead of the output nodes OUT1 and OUT2. When the test enable signal TE is active, the PMOS transistors P11 and P12 are turned off. When this occurs, the series combination of the normal resistor Rn41 and termination resistor Rt41 is provided between the output node OUT1 and the power supply line Vdd and the series combination of the normal resistor Rn42 and termination resistor Rt42 is provided between the output node OUT2 and the power supply line Vdd. In the event the series combination of the normal resistor Rn41 and termination resistor Rt41 is greater than the termination resistor Rt11 of FIG. 10, the swing width of the output signals DQ and DQB may be greater in the driver 330D of FIG. 13 relative to the driver 330A of FIG. 10.

Figure 14:
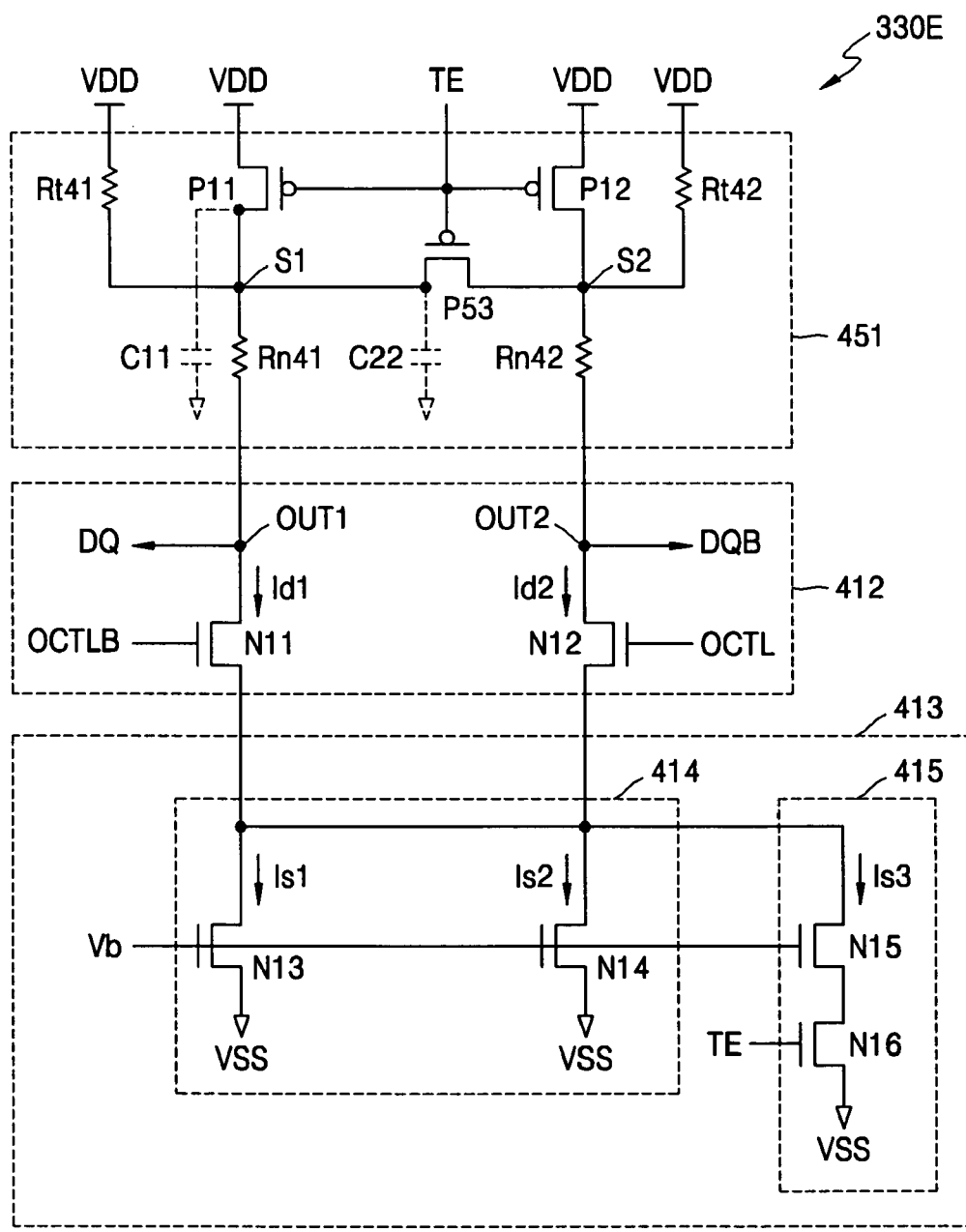
FIG. 14 is an electrical schematic of an embodiment of the differential output driver stage of FIG. 9.

FIG. 14 illustrates an output driver 330E according to another embodiment of the present invention. This output driver 330E is similar to the output driver 330C of FIG. 11, however, the load circuit 451 includes a PMOS equalization transistor P53, which is responsive to the test enable signal TE. During a normal mode of operation, when the test enable signal TE is inactive (i.e., TE=0), the nodes S1 and S2 will be shorted together by PMOS transistor P53 and pulled high to the power supply voltage by PMOS transistors P11 and P12. The PMOS equalization transistor P53 will add some additional parasitic capacitance (e.g., C52) to the nodes S1 and S2, but this additional capacitance may be offset by a lower overall RC loading on the output nodes OUT1 and OUT2.

Figure 15:
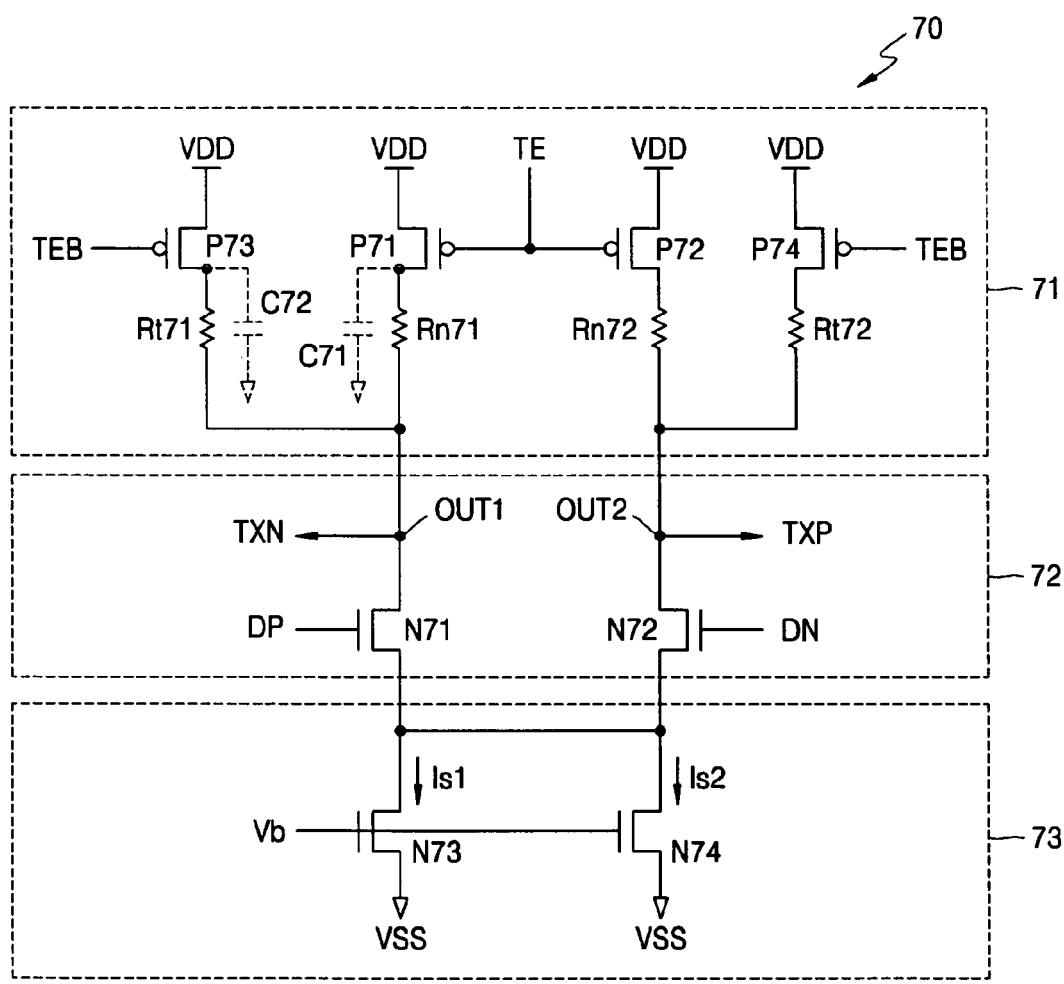
FIG. 15 is an electrical schematic of a differential output driver stage that may be used as a comparative example relative to the output driver stages of FIGS. 10-14.

FIG. 15 is an electrical schematic of a differential output driver stage 70 that may be used as a comparative example relative to the output driver stages of FIGS. 10-14. This driver stage 70 includes a load circuit 71, a comparing circuit 72 and a current source 73. The current source 73 includes NMOS transistors N73 and N74, which are responsive to a bias voltage and sink currents Is1 and Is2, respectively, from the comparing circuit 72. The comparing circuit 72 includes input transistors N71 and N72, which are responsive to a pair of differential input signals DP and DN. The drain terminals of the NMOS transistors N71 and N72 are connected to the output nodes OUT1 and OUT2, which produce a pair of differential output signals TXP and TXN. The load circuit 71 is illustrated as including a pair of termination resistors Rt71 and Rt72, a pair of normal mode resistors Rn71 and Rn72 and four PMOS pull-up transistors P71-P74, connected as illustrated. When the test enable signal TE is active during a test mode of operation, the PMOS transistors P73 and P74 are turned on and the PMOS transistors P71 and P72 are turned off. During this test mode, the swing widths of the output signals TXP and TXN will be increased and the relatively large resistors Rt71 and Rt72 (e.g., 1 K ohm resistors) will be active in the pull-up paths of the load circuit 71. Alternatively, when the test enable signal TE is inactive during a normal mode of operation, the PMOS transistors P71 and P72 are turned on and the PMOS transistors P73 and P74 are turned off. However, if the parasitic capacitances provided by the PMOS transistors P71-P74 are significant, the maximum speed of operation of the driver stage 70 during the normal mode of operation may be limited. These parasitic capacitances are illustrated by C71 and C72 for PMOS transistors P71 and P73. The other PMOS transistors P72 and P74 have similar parasitic capacitances (not shown).

Figure 16:
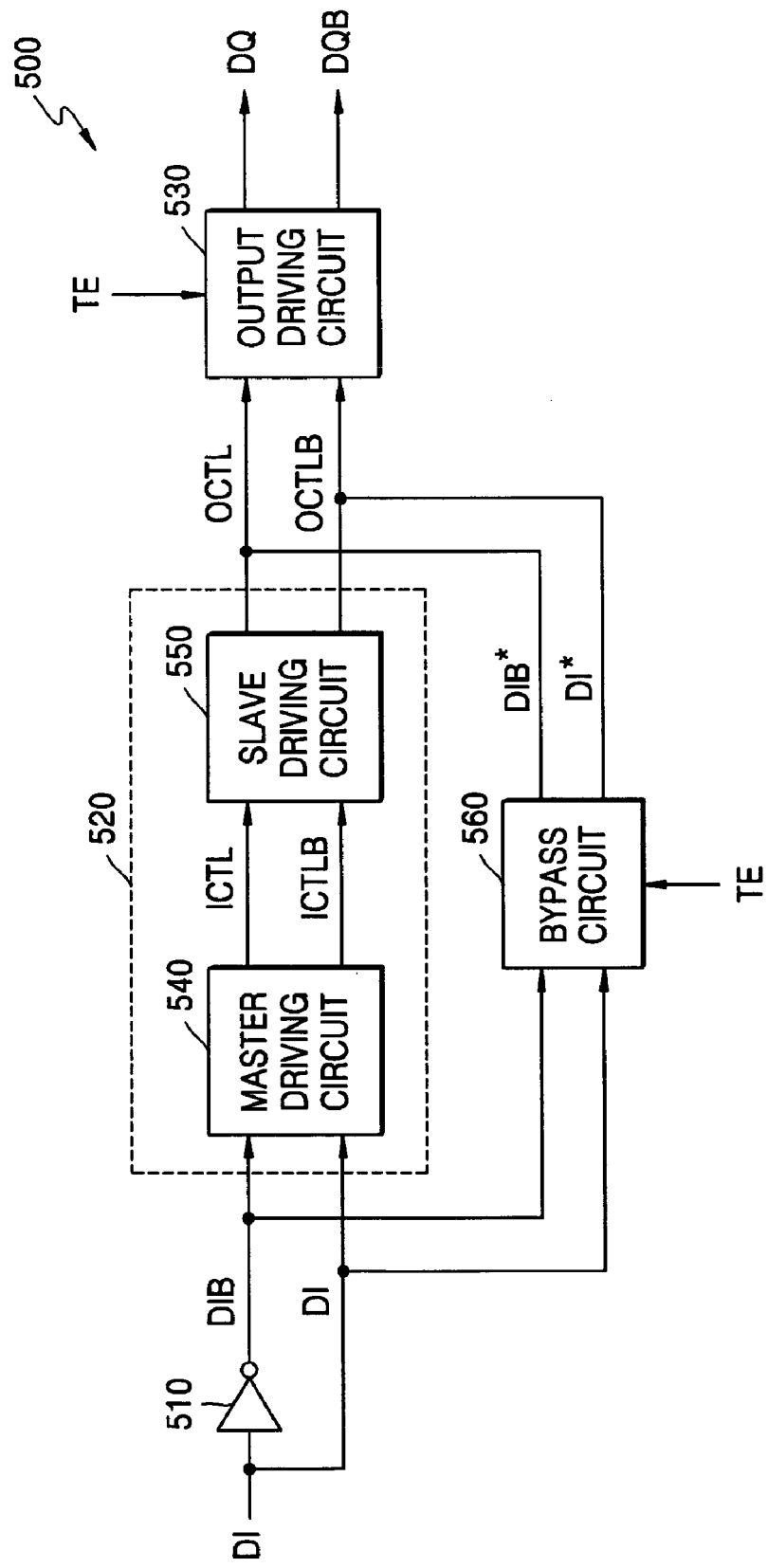
FIG. 16 is an electrical schematic of a differential output driver having multiple stages and a differential bypass circuit, according to embodiments of the present invention.

FIG. 16 is an electrical schematic of a differential multi-stage output driver 500 having multiple stages and a differential bypass circuit, according to embodiments of the present invention. This output driver 500 incorporates a differential bypass circuit 560, which is related to the bypass circuit 240 of FIG. 7, and a plurality of stages that process differential signals in a manner similar to the stages illustrated in FIG. 9. An electrical schematic of the bypass circuit 560 is illustrated in detail in FIG. 17. The multi-stage output driver 500 includes a buffer 510 (e.g., inverter), a control driver stage 520 and an output driver stage 530. The control driver stage 520 includes an input driver stage 540, shown as a master driver, and an intermediate driver stage 550, shown as a slave driver. The master driver 540 generates a pair of control signals ICTL and ICTLB in response to a pair of data input signals DIB and DI and the slave driver 550 generates a pair of control signals OCTL and OCTLB in response to the pair of control signals ICTL and ICTLB. Neither the master driver 540 nor the slave driver 550 is responsive to a test enable signal TE, which means the control signals ICTL and ICTLB will have reduced swing widths during both normal and test modes of operation. The control signals OCTL and OCTLB are provided to the output driver 530, which generates a pair of data output signals DQ and DQB and is responsive to the test enable signal TE. The signal swing widths of the data output signals DQ and DQB can be maintained at full rail-to-rail levels during the test mode of operation when the signal swing widths of the control signals OCTL and OCTLB are increased by the bypass circuit 560.

Accordingly, the differential multi-stage output driver 500 is responsive to a pair of input signals (OCTL, OCTLB) and a swing width control signal TE. The output driver 500 configured to generate a pair of output signals (DQ, DQB) having a first swing width when the swing width control signal designates a normal mode of operation and a second swing width greater than the first swing width when the swing width control signal designates a test mode of operation. As illustrated by FIG. 10, the output driver may include a comparing circuit 412 responsive to the pair of input signals, a load circuit 411 and a current source 413. The current source 413 includes a primary current source 414 and a secondary current source 415. A multi-stage driver 520 and a multi-stage bypass buffer 560 are also provided to control the swing widths of the input signals OCTL, OCTLB.

Figure 17:
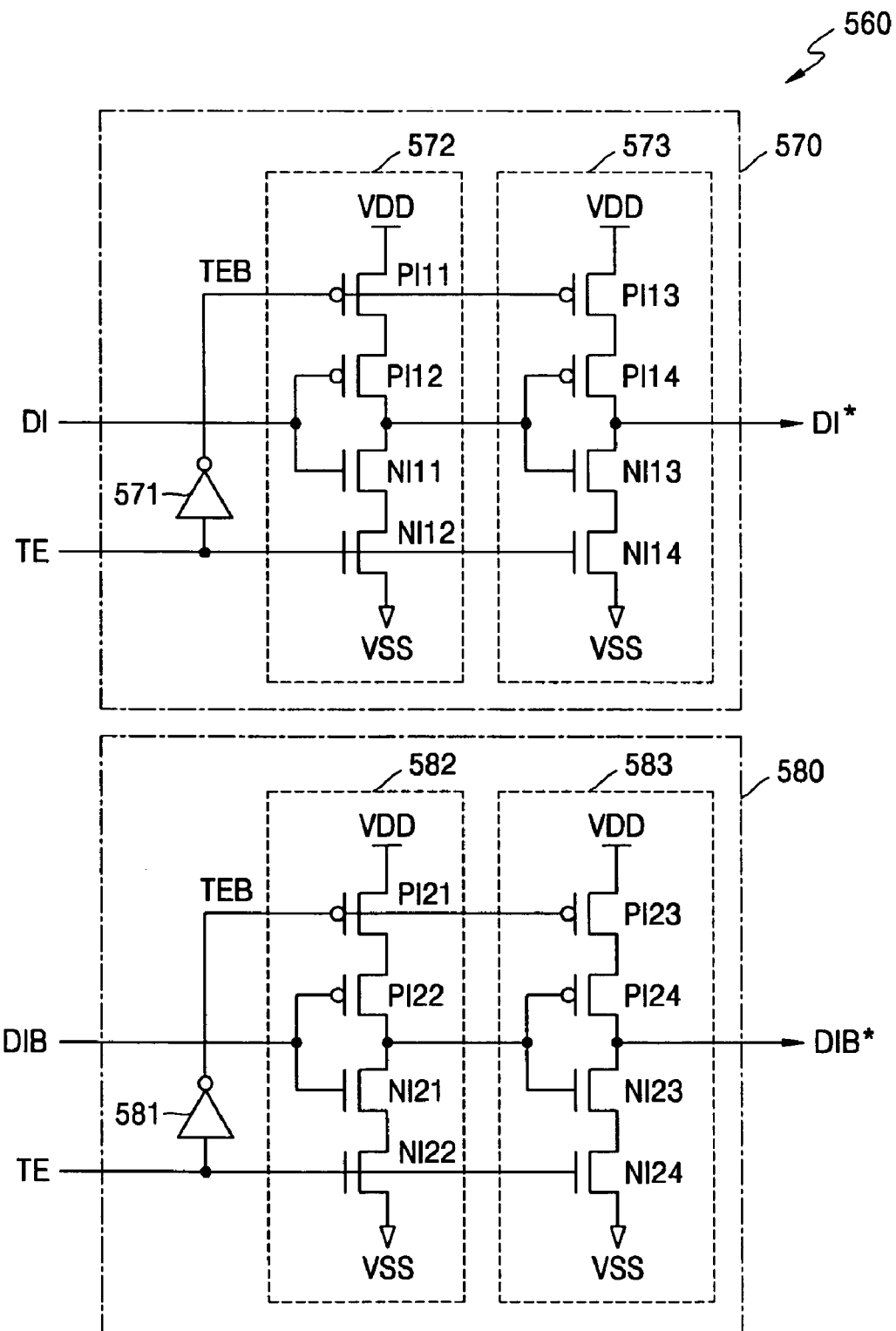
FIG. 17 is an electrical schematic of the differential bypass circuit of FIG. 16.

As will now be described in detail with respect to FIG. 17, the bypass circuit 560 includes a true bypass circuit 570 and a complementary bypass circuit 580. The true bypass circuit 570 includes a buffer 571, a first stage 572 and a second stage 573. The complementary bypass circuit 580 includes a buffer 581, a first stage 582 and a second stage 583. The first stage 572 includes a totem pole arrangement of PMOS and NMOS transistors, which are shown as PI11, PI12, NI11, NI12. The second stage 573 includes a totem pole arrangement of PMOS and NMOS transistors, which are shown as PI13, PI14, NI13, NI14. The first stage 582 includes a totem pole arrangement of PMOS and NMOS transistors, which are shown as PI21, PI22, NI21, NI22. The second stage 583 includes a totem pole arrangement of PMOS and NMOS transistors, which are shown as PI23, PI24, NI23, NI24.

Each of these stages is responsive to the test enable signal TE. Setting the test enable signal TE to an inactive level (i.e., TE=0) causes the true data output DI* of the true bypass circuit 570 and the complementary data output DIB* of the complementary bypass circuit 580 to enter high impedance states. In particular, setting the test enable signal TE to an inactive level disables NMOS transistors NI12, NI14, NI22 and NI24 and disables PMOS transistors PI11, PI13, PI21 and PI23, which are responsive to signal TEB. Alternatively, setting the test enable signal TE to an active level during a test mode of operation enables the true and complementary bypass circuits 570 and 580 and causes the true and complementary data output signals DI* and DIB* to maintain the full swing widths of the true and complementary data input signals DI and DIB. Referring again to FIG. 16, these true and complementary data output signals DI* and DIB* are provided as inputs to the output driver 530 to thereby enable the output driver 530 to drive the outputs DQ and DQB at full rail-to-rail levels during test more operation.

Figure 18:
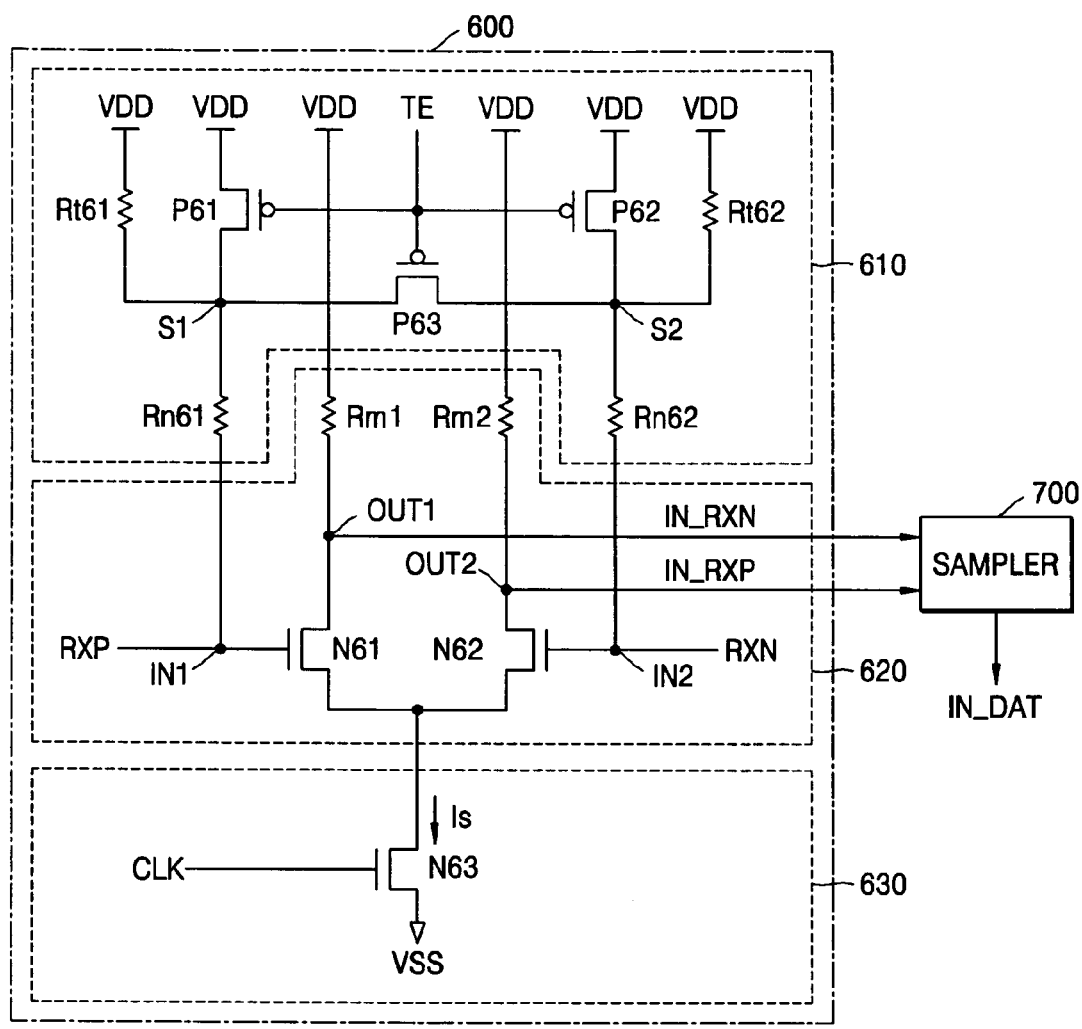
FIG. 18 is an electrical schematic of a differential input circuit and input signal sampler, according to embodiments of the present invention.

A differential input circuit 600 according to additional embodiments of the present invention is illustrated by FIG. 18, along with an input signal sampler 700. The differential input circuit 600 includes a load circuit 610, a comparing circuit 620 and an enable circuit 630. The enable circuit 630 includes an NMOS pull-down transistor N63, which is responsive to a clock signal CLK. The comparing circuit 620 includes first and second NMOS input transistors N61 and N62. The gate terminal of the first NMOS input transistor N61 is connected to input node IN1, which receives a true input signal RXP. The gate terminal of the second NMOS input transistor N62 is connected to input node IN2, which receives a complementary input signal RXN. The drain terminals of the NMOS input transistors N61 and N62 are connected to the output nodes OUT1 and OUT2. From these nodes, the output signals IN_RXN and IN_RXP are produced and provided as inputs to a sampler circuit 700, which generates a data input signal IN_DAT. The drain terminals of the NMOS input transistors N61 and N62 are also connected to the resistors Rm1 and Rm2, which are directly connected to the power supply line Vdd.

The load circuit 610 includes normal mode resistors Rn61 and Rn62, which influence the swing widths of the input signals RXP and RXN. The resistor Rn61 is connected to node S1 and the resistor Rn62 is connected to node S2. PMOS equalization transistor P63 has source and drain terminals connected to the nodes S1 and S2, as illustrated. Node S1 is also connected to a termination resistor Rt61 and a drain terminal of PMOS pull-up transistor P61. Node S2 is also connected to a termination resistor Rt62 and a PMOS pull-up transistor P62. The PMOS transistors P61, P62 and P63 are responsive to the test enable signal TE. When the test enable signal TE is set to an inactive level, the termination resistors Rt61 and Rt62 are effectively removed from the load circuit 610 and nodes S1 and S2 are pulled directly to the power supply voltage Vdd. Setting the nodes S1 and S2 to the power supply voltage Vdd will limit the swing widths of the input signals RXP and RXN and thereby limit the swing widths of the output signals IN_RXN and IN_RXP. In contrast, when the test enable signal TE is set to an active level (i.e., TE=1), the PMOS transistors P61, P62 and P63 are turned off. Accordingly, the pull-up path defined by the termination resistor Rt61 and the normal mode resistor Rn61 operates as a voltage divider to thereby preserve a full swing width of the input signal RXP (and output signal IN_RXN). Similarly, the pull-up path defined by the termination resistor Rt62 and the normal mode resistor Rn62 operates as a voltage divider to thereby preserve a full swing width of the input signal RXN (and output signal IN_RXP).

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit device, comprising:
   an output driver responsive to an input signal and a swing width control signal, said output driver configured to generate an output signal having a first swing width when the swing width control signal designates a normal mode of operation and a second swing width greater than the first swing width when the swing width control signal designates a test mode of operation; and
   a control driver configured to generate the input signal having multiple swing widths in response to the swing width control signal; and
   wherein said control driver comprises a multi-stage bypass buffer configured to selectively generate the input signal at an output thereof when the swing width control signal designates the test mode of operation and further configured to dispose the output in a high impedance state when the swing width control signal designates the normal mode of operation.

2. The integrated circuit device of claim 1, further comprising a multi-stage driver having an output electrically coupled to the output of the multi-stage buffer and an input of said output driver, said multi-stage driver configured to generate a version of the input signal having a less than rail-to-rail swing width.

3. An integrated circuit device, comprising:
   an output driver responsive to an input signal and a swing width control signal, said output driver configured to generate an output signal having a first swing width when the swing width control signal designates a normal mode of operation and a second swing width greater than the first swing width when the swing width control signal designates a test mode of operation;
   a multi-stage driver having an output electrically coupled to an input of said output driver and configured to generate the input signal having a less than rail-to-rail swing width; and
   a multi-stage bypass buffer electrically coupled to the input of said output driver and responsive to the swing width control signal, said multi-stage bypass buffer configured to selectively increase the swing width of the input signal when the swing width control signal designates the test mode of operation.

4. The integrated circuit device of claim 3, wherein said multi-stage bypass buffer is configured to selectively increase the swing width of the input signal to about a rail-to-rail level when the swing width control signal designates the test mode of operation.

5. The integrated circuit device of claim 3, wherein said output driver comprises a driver stage responsive to the input signal and a swing width adjusting circuit responsive to the input signal and the swing width control signal.

6. The integrated circuit device of claim 5, wherein an output node of the driver stage is connected to an output node of the swing width adjusting circuit.

7. The integrated circuit device of claim 6, wherein the swing width adjusting circuit comprises at least one switching element responsive to the swing width control signal.

8. The integrated circuit device of claim 5, wherein the swing width adjusting circuit comprises at least one switching element responsive to the swing width control signal.

9. An integrated circuit device, comprising:
   an output driver responsive to a pair of input signals and a swing width control signal, said output driver configured to generate a pair of output signals having a first swing width when the swing width control signal designates a normal mode of operation and a second swing width greater than the first swing width when the swing width control signal designates a test mode of operation.

10. The integrated circuit device of claim 9, wherein said output driver comprises:
    a comparing circuit responsive to the pair of input signals;
    a load circuit electrically coupled to said comparing circuit and output terminals of said output driver; and
    a current source electrically coupled to said comparing circuit.

11. The integrated circuit device of claim 10, wherein said load circuit and said current source are responsive to the swing width control signal.

12. An integrated circuit device, comprising:
    an output driver responsive to a pair of input signals and a swing width control signal, said output driver configured to generate a pair of output signals having a first swing width when the swing width control signal designates a normal mode of operation and a second swing width greater than the first swing width when the swing width control signal designates a test mode of operation, said output driver comprising:
  a comparing circuit responsive to the pair of input signals;
  a load circuit electrically coupled to said comparing circuit and output terminals of said output driver; and
  a current source electrically coupled to said comparing circuit;
wherein said load circuit and said current source are responsive to the swing width control signal; and
wherein said current source comprises a primary current source that is not responsive to the swing width control signal and a secondary current source responsive to the swing width control signal.

13. The integrated circuit device of claim 12, wherein the secondary current source increases a pull-down current provided by said current source when the swing width control signal designates a test mode of operation.

14. An integrated circuit device, comprising:
  an output driver responsive to a pair of input signals and a swing width control signal, said output driver configured to generate a pair of output signals having a first swing width when the swing width control signal designates a normal mode of operation and a second swing width greater than the first swing width when the swing width control signal designates a test mode of operation; and
  a multi-stage driver having a pair of outputs electrically coupled to a pair of inputs of said output driver and configured to generate the pair of input signals having less than rail-to-rail swing widths.

15. The integrated circuit device of claim 14, further comprising a multi-stage bypass buffer electrically coupled to the pair of inputs of said output driver and responsive to the swing width control signal, said multi-stage bypass buffer configured to selectively increase the swing widths of the pair of input signals when the swing width control signal designates the test mode of operation.

* * * * *